(12) United States Patent
Ho et al.

(10) Patent No.: US 7,468,299 B2
(45) Date of Patent: Dec. 23, 2008

(54) NON-VOLATILE MEMORY CELLS AND METHODS OF MANUFACTURING THE SAME

(75) Inventors: ChiaHua Ho, Kaohsiung (TW); Erh-Kun Lai, Taichung County (TW); Hang-Ting Lue, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 391 days.

(21) Appl. No.: 11/197,659

(22) Filed: Aug. 4, 2005

(65) Prior Publication Data

US 2007/0031999 A1    Feb. 8, 2007

(51) Int. Cl.
*H01L 21/336* (2006.01)
(52) U.S. Cl. ............ 438/259; 438/261; 257/E21.429
(58) Field of Classification Search ............ 438/259, 438/261, 262, 288, 589; 257/E21.428, E21.429
See application file for complete search history.

(56) References Cited

U.S. PATENT DOCUMENTS

| | | | |
|---|---|---|---|
| 4,536,944 A | 8/1985 | Bracco et al. | |
| 4,845,539 A | 7/1989 | Inoue | |
| 6,191,000 B1 | 2/2001 | Huang et al. | |
| 6,297,096 B1 | 10/2001 | Boaz | |
| 6,429,063 B1 | 8/2002 | Eitan | |
| 6,477,084 B1 | 11/2002 | Eitan | |
| 6,495,430 B1 | 12/2002 | Tsai et al. | |
| 6,541,350 B2 | 4/2003 | Chen | |
| 6,548,861 B2 * | 4/2003 | Palm et al. ............ 257/330 |
| 6,569,735 B2 | 5/2003 | Su | |
| 6,589,854 B2 | 7/2003 | Liu et al. | |
| 6,664,588 B2 | 12/2003 | Eitan | |
| 6,713,365 B2 | 3/2004 | Lin et al. | |
| 6,808,995 B2 | 10/2004 | Lin et al. | |
| 6,828,197 B1 | 12/2004 | Lai | |
| 6,853,587 B2 | 2/2005 | Forbes | |
| 2003/0076709 A1 | 4/2003 | Huang et al. | |
| 2003/0193062 A1 | 10/2003 | Jong et al. | |
| 2004/0233762 A1 | 11/2004 | Mihnea et al. | |

FOREIGN PATENT DOCUMENTS

JP    2001-351895    * 12/2001

OTHER PUBLICATIONS

Willer, et al., "UMEM: A U-shape Non-Volatile-Memory Cell", IEEE NVSWM 2003, pp. 42-43.
Adams, et al., "SONOS Nonvolatile Semiconductor Memories for Space and Military Applications", Aerospace Conference, 2001 IEEE Proceedings.

(Continued)

*Primary Examiner*—Chandra Chaudhari
(74) *Attorney, Agent, or Firm*—Jianq Chyun IP Office

(57) ABSTRACT

Methods for forming non-volatile memory cells include: (a) providing a semiconductor substrate having at least two source/drain regions, and a dielectric material disposed on the substrate above at least one of the at least two source/drain regions wherein the dielectric material has an exposed surface, and wherein the at least two source/drain regions are separated by a recess trench having an exposed surface, wherein the trench extends downward into the substrate to a depth position below the at least two source/drain regions; (b) forming a charge-trapping layer on the exposed surfaces of the dielectric material and the recess trench; and (c) forming a gate above the charge-trapping layer.

21 Claims, 7 Drawing Sheets

OTHER PUBLICATIONS

Man, et al., "A 2-bit highly scalable nonvolatile memory cell with two electrically isolated charge trapping sites", *Microelectronics Reliability*, vol. 45, pp. 349-354 (2005).

Eitman, et al., "Can NROM, a 2-bit, Trapping Storage NVM Cell, Give a Real Challenge to Floating Gate Cell?", *International Conference on Solid State Device and Materials*, Tokyo, pp. 1-3, (1999).

Maayan, et al., "A 512Mb NROM Data Storage Memory with 8MB/s data rate", *ISSCC (International Solid-State Circuits Conference)*, San Francisco, (2002).

Janai, et al., "Data Retention Reliability Model of NROM Nonvolatile Memory Products", *IEEE Transactions on Device and Materials Reliability*, vol. 4, No. 3 (2004).

* cited by examiner

NON-VOLATILE MEMORY CELLS AND METHODS OF MANUFACTURING THE SAME

BACKGROUND OF THE INVENTION

Non-volatile memory ("NVM") refers to semiconductor memory which is able to continually store information even when the supply of electricity is removed from the device containing the NVM cell. NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed to prevent loss of programmed data. Typically, non-volatile memory can be programmed, read and/or erased based on the device's end-use requirements, and the programmed data can be stored for a long period of time.

As the information technology market has grown vastly in the past twenty years or so, portable computers and the electronic communications industry have become the main driving force for semiconductor VLSI (very large scale integration) and ULSI (ultra large scale integration) design. As a result, low power consumption, high density and re-programmable non-volatile memory are in great demand. These types of programmable and erasable memories have become essential devices in the semiconductor industry.

A rising demand for memory capacity has translated into higher requirements for integration level and memory density. Dual bit cells which can store two bits of information in each memory cell are known in the art but are not yet prevalent in use. Some dual bit cells have multiple threshold voltage levels, where every two threshold voltage levels together store a different bit. These types of dual bit cells involve operational complexities which discourage their widespread use. Other dual bit cells have two separate storage sites and store one bit in each site on either side of the cell. One kind of dual bit cell of the latter variety is known as Nitride Read Only Memory (NROM).

Nitride read only memory is a type of charge-trapping semiconductor device for data storage. In general, an NROM cell is composed of a MOSFET (metal-oxide-silicon field effect transistor) having an ONO (oxide-nitride-oxide) gate dielectric layer disposed between the gate and the source/drain semiconductor material. The nitride layer in the ONO gate dielectric layer is able to trap electrons in a localized manner when programmed. Charge localization refers to the nitride material's ability to store the charge without much lateral movement of the charge throughout the nitride layer. This is in contrast to conventional floating gate technology wherein the floating gate is conductive and the charge is spread laterally throughout the entire floating gate. Programming (i.e., charge injection) of the charge-trapping layer in NROM devices can be carried out via channel hot electron ("CHE") injection. Erasing (i.e., charge removal) in NROM devices can be carried out via band-to-band hot hole tunneling. The stored charge can be repeatedly programmed, read, erased and/or reprogrammed via known voltage application techniques, and reading can be carried out in a forward or reverse direction. Localized charge-trapping technology allows two separate bits per cell, thus doubling memory density.

Although localized charge-trapping read only memory, such as NROM, has the advantage of two-bit storage in each cell, the constant industry demand to reduce overall memory cell dimensions has adverse implications for this technology. The trend in integrated circuit manufacture to produce memory cells with reduced feature sizes can result in unwanted phenomena. This is particularly true for MOSFETs as one of the dimensions thus reduced is channel length (i.e., the distance between the source and drain regions). As MOSFET channel length is reduced, charges in depletion regions near the source and/or drain may link with charges in the channel region, thereby skewing the threshold voltage, increasing the occurrence of unwanted "punch-through" and altering other device characteristics of the MOSFET. These effects are collectively known as "short-channel effects." A number of prior art devices have been proposed to address the short-channel effects. Some have proposed reducing the dimensions of the source and drain depletion regions. Such a reduction, however, has an unintended adverse effect of increasing bit-line (source/drain) resistance, which in turn can affect the voltage-current characteristics of the device and/or increase the heat produced by the device.

Another problem encountered in localized charge-trapping dual bit cells, such as NROM cells, is the so-called "second-bit effect", which can become more pronounced in short channel devices. The second-bit effect refers to the adverse effects one stored bit (trapped charge) has on the manipulation (e.g., programming and/or reading) of the other bit. For example, in some cases, when programming a second bit by channel hot electron injection there is a possibility that some electrons will be unintentionally injected into the charge-trapping layer at the first bit location, especially where the channel length is short and the first and second bits are closer to each other. As a result of this type of unintentional electron injection, the already programmed first bit can be "overwritten" (i.e., over-programmed), which in turn affects the width of the depletion layer under the expanded bit. As channel length decreases the possibility of overwriting increases. In addition, the overwriting effect described above also can lead to the second-bit effect characterized by alteration of the threshold voltage of the other bit during its reading operation.

Another problem encountered in memory devices, such as those which use channel hot electron programming and/or band-to-band hot hole erasing methods, is breakdown between the source/drain regions and gate, which results from the high voltage differential between the source/drain regions and the gate. Buried-diffusion oxide materials deposited above the source/drain regions have been used to decrease the possibility of breakdown between the source/drain regions and the gate. However, as memory cells become smaller and smaller, conventional buried-diffusion oxides become less capable of preventing or diminishing breakdown because their dielectric properties are insufficient at decreased dimensions.

Despite these problems encountered with the scale down of charge-trapping memory cells, interest in their production, architecture and use continues to grow. It is expected that NROM technology will eventually compete with conventional floating gate technology for many NVM applications. Accordingly, it is desirable to provide a charge-trapping NVM cell structure capable of decreased dimensioning and to provide a method for manufacture of such an NVM cell in which short-channel effects, the second-bit effect and breakdown between the source/drain and gate are minimized.

BRIEF SUMMARY OF THE INVENTION

The present invention relates, in general, to methods of manufacturing non-volatile memory cells for semiconductor devices, and to non-volatile memory cells which exhibit improved performance properties and which can be prepared by methods in accordance with the present invention. More particularly, the present invention relates to non-volatile memory cells which have a lengthened channel dimension without a corresponding increase in overall cell length and a dielectric material disposed between the gate and a source/drain region. The invention also relates to methods of manufacturing such non-volatile memory cells.

One embodiment of the present invention includes memory cells which comprise:
(a) a semiconductor substrate having at least two source/drain regions; (b) a dielectric material disposed on a surface of the substrate above at least one of the at least two source/drain regions, wherein the at least two source/drain regions are separated by a recess trench having a surface extending downward into the substrate to a depth position below the at least two source/drain regions; (c) a charge-trapping layer disposed on the surface of the dielectric layer and the recess trench surface; and (d) a gate material layer disposed on the charge-trapping layer.

Another embodiment of the present invention includes methods which comprise:
(a) providing a semiconductor substrate having at least two source/drain regions, and a dielectric material disposed on the substrate above at least one of the at least two source/drain regions wherein the dielectric material has an exposed surface, and wherein the at least two source/drain regions are separated by a recess trench having an exposed surface, wherein the trench extends downward into the substrate to a depth position below the at least two source/drain regions; (b) forming a charge-trapping layer on the exposed surfaces of the dielectric material and the recess trench; and (c) forming a gate above the charge-trapping layer.

In certain preferred embodiments of the methods according to the present invention, providing the semiconductor substrate comprises: (i) providing a substrate having an extended buried diffusion implant region; (ii) depositing the dielectric material on a surface of the substrate above one or more areas of the extended buried diffusion implant region; (iii) forming the recess trench such that the recess trench extends downward into the substrate through the extended buried diffusion implant region whereby the at least two source/drain regions are formed.

In certain other preferred embodiments of the methods according to the present invention, providing the semiconductor substrate comprises: (i) forming the at least two source/drain regions in the substrate; (ii) depositing the dielectric material on a surface of the substrate above one or more of the at least two source/drain regions; (iii) forming the recess trench between the at least two source/drain regions such that the recess trench extends downward into the substrate to the depth position below the at least two source/drain regions.

In still further preferred embodiments of the present invention, the non-volatile memory cells comprise Nitride Read Only Memory ("NROM") cells, wherein the charge-trapping layer comprises a nitride layer sandwiched between two dielectric layers. It is also preferable in many preferred embodiments of the present invention that the memory cell comprises an n-channel device, wherein the at least two source/drain regions are n-type doped and the substrate is a p-type substrate.

In still further preferred embodiments of the present invention, the dielectric material disposed on the surface of the substrate above at least one of the at least two source/drain regions comprises a high density plasma dielectric material.

Non-volatile memory cells according to the present invention exhibit greatly improved performance including decreased second bit-effect and limited breakdown between source/drain and gate.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 3a and 3b are schematic representations of an NROM cell in accordance with an embodiment of the present invention, wherein FIG. 3b is a cross-sectional view taken along the line 3b-3b.

DETAILED DESCRIPTION OF THE INVENTION

Figure 1:
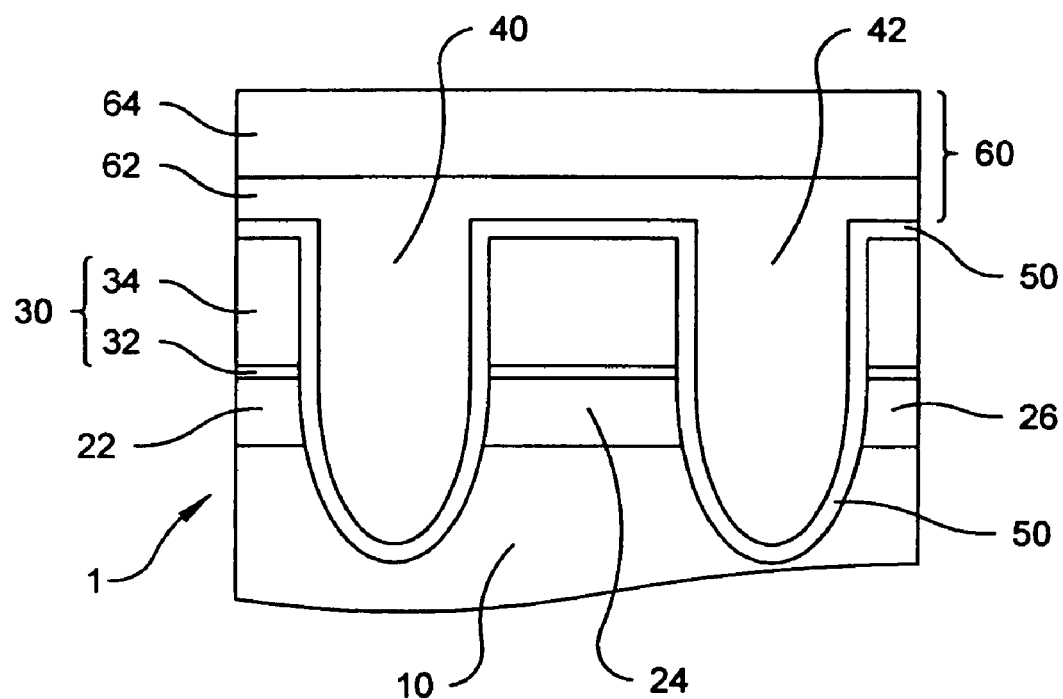
FIG. 1 is a cross-sectional schematic representation of an NROM cell in accordance with an embodiment of the present invention.

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that are conventionally used in the art.

FIG. 1 illustrates a portion of an NROM non-volatile memory cell device (1) in accordance with one preferred embodiment of the present invention. The portion of the memory cell depicted in FIG. 1 comprises a substrate (10) having at least two source/drain regions (22, 24, 26). As shown in FIG. 1, the memory cell also comprises a dielectric material (34) on top of a gate dielectric layer (32) above each of the source/drain regions (22, 24, 26). A dielectric material (34) alone, or a dielectric material (34) in conjunction with a gate dielectric layer can be referred to as a buried diffusion dielectric barrier. In the embodiment shown in FIG. 1, the dielectric material (34) and the gate dielectric layer (32) together, comprise a burried diffusion dielectric barrier (30). In several preferred embodiments, the dielectric material (34) comprises a high density plasma dielectric material. Recess trenches (40, 42) are shown extending down into the substrate (10) to a depth position below the source/drain regions (22, 24, 26). An ONO charge-trapping layer (50) is located on the surfaces of the dielectric material (34) and the recess trenches (40, 42). A gate (60), comprising (i) a polycrystalline silicon layer (62), which also fills the voids of the recess trenches (40, 42), and (ii) a metal silicide layer (64), is deposited above the ONO charge-trapping layer (50).

A memory cell in accordance with the present invention comprises a semiconductor substrate. In many preferred embodiments of the present invention, the semiconductor substrate comprises a silicon material. Silicon wafers prepared via standard techniques can be used to prepare a suitable substrate. For example, suitable wafers can be prepared via a process wherein silicon is grown from a small crystal, called the seed crystal, rotated and slowly withdrawn from a molten hyper-pure silicon to give a cylindrical crystal, which is then sliced to obtain thin disks, which after slicing, are finely ground, mirror-smooth polished and cleaned.

In accordance with several preferred embodiments of the present invention, the silicon semiconductor substrate comprises p-type silicon. Generally, p-type silicon substrates capable of use in accordance with preferred embodiments of the present invention include silicon wafers which have been lightly p-doped. In those embodiments of the present invention wherein the source/drain regions comprise n+ doped implants, a lightly p-doped substrate can be advantageous in programming and reading of the memory cell due to the reverse bias of the PN junctions. P-type doping of silicon can be carried out in any suitable manner, such as, via an implantation of, for example, boron, $BF_2$ or gallium or any other free-electron deficient element capable of use in semiconductor materials. Preferably, the p-type doping is carried out at a dosage level of from about $10^{13}/cm^3$ to about $10^{16}/cm^3$. More preferably, the p-type doping is carried out at a dosage level of from about $10^{14}/cm^3$ to about $10^{15}/cm^3$.

It should be understood that while many of the preferred embodiments of the invention described herein depict NPN junctions wherein the semiconductor substrate comprises p-type silicon having two or more source/drain regions formed via n-type doping, the memory cells of the present invention also include PNP type semiconductor devices, and the methods of the present invention can be employed to prepare PNP memory.

A memory cell in accordance with the present invention has at least two source/drain regions. As is understood by those of ordinary skill in the art, each memory cell comprises two source/drain regions, each of which may serve as a source or a drain, depending upon the location of the applied voltages. The term "source/drain region", as used herein, refers to the dual nature of such regions in that they can function as either a source or a drain depending upon the applied voltage. When referring to a specific operation in a memory cell in accordance with the present invention wherein one region serves as the source and the other region serves as the drain, the terms "source" and "drain" may be used separately in reference to the particular region. However, the use of either term separately is not to be construed as limiting either region in its function, or as limiting the invention in regard to any specific location of the source and the drain.

A memory cell in accordance with the present invention may comprise a semiconductor substrate having more than two source/drain regions constituting a plurality of memory cells. It is to be understood that any one source/drain region may function as a source or drain for both adjacent regions, or it may function as a drain for a source adjacent in one direction and as a source for a drain adjacent in the opposite direction. For example, referring to FIG. 1, source/drain region (24) may serve as the source for both source/drain region (22) and source/drain region (26), when regions (22) and (26) operate as drains, or as the drain for both when they operate as sources. Alternatively, source/drain region (24) can serve as a drain for source/drain region (22) to the left when region (22) operates as a source, and as a source for source/drain region (26) to the right when region (26) operates as a drain.

In general, the at least two source/drain regions will each comprise an area doped in a manner corresponding in complementary fashion to the type of substrate doping employed. In other words, where a p-type substrate is employed, the source/drain regions are n-doped, and vice versa. Thus, in preferred embodiments wherein the substrate comprises p-type silicon, the at least two source/drain regions will comprise n+ doped regions, preferably having a high dose of n-type doping. In more preferred embodiments of the present invention, the n+doping will comprise ion implantation of one or more elements selected from arsenic, phosphorous, and nitrogen, wherein the dosage of ion implantation is about $10^{19}/cm^3$ to $10^{20}/cm^3$. The depth of the implantation of each of the at least two source/drain regions in the silicon substrate can extend about 30 to about 200 nanometers below the substrate surface, depending on the technology generation or node of the device (i.e., the minimum feature size, for example 130 nm). For example, in one embodiment of the present invention with a generation node of 130 nanometers, the depth of the implantation of the at least two source/drain regions can be about 100 nanometers into the substrate as measured from the substrate surface.

In certain preferred embodiments of the present invention, the substrate can have an extended buried diffusion layer below the surface. For example, referring to FIG. 4(a), a portion of a substrate (410) is shown in cross-section, and an extended buried diffusion layer (428) is shown along the length of the portion of the substrate (410). The extended buried diffusion layer can comprise p-type or n-type doping, depending upon whether the end-device is to be an NPN or a PNP junction memory cell. The p-type-doping and the dosage level of the doping in the extended buried diffusion layer can preferably comprise ion implantation of one or more elements selected from arsenic, phosphorous, and nitrogen, wherein the dosage of ion implantation is from about $10^{19}/cm^3$ to $10^{20}/cm^3$, as described above. The depth of the implantation of the extended buried diffusion layer can extend into the substrate to a depth of about 30 to about 200 nanometers below the substrate surface. The extended buried diffusion layer will generally extend across an area of the substrate coincident with, or slightly larger than, the area to be occupied by an array of memory cells. For example, using an arbitrary size, if a memory cell array will occupy an area of a silicon wafer having dimensions of approximately 10 μm×100 μm, then an extended buried diffusion layer of approximately 10 μm×100 μm, or slightly larger, can be implanted in the substrate where the memory cell array is to be located.

The at least two source/drain regions of memory cells in accordance with the present invention are separated by a recess trench which has a surface extending downward into the silicon substrate to a depth position which is below the at least two source/drain regions. The depth position of the recess trench is preferably at least about 50 to 300 nanometers below the bottom of the source/drain regions. For example, in one embodiment of the present invention, the depth position of the trench(es) can be about 200 nanometers below the bottom of the buried-diffusion implantation regions which comprise the source/drain regions of the memory device with a trench width of about 200 nanometers, and the depth of the buried-diffusion implantation regions can extend about 100 nanometers below the surface of the substrate. As used herein, "trench width" refers to the distance across the trench from the source side to the drain side, whereas "channel length" refers to the distance from the source to the drain under the trench. As used herein, "trench depth" refers to the depth of the trench as measured from the bottom of the source/drain regions, and "total trench depth" refers to the depth of the trench as measured from the substrate surface. Thus in the embodiment just described, the trench depth is about 200 nanometers and the total trench depth is about 300 nanometers. In preferred embodiments of the present invention, the ratio of trench depth to trench width is about 1:1 to about 3:1, and more preferably about 1:1.

As described in more detail below in reference to certain preferred embodiments of the methods according to the present invention, the at least two source/drain regions can be formed subsequent to the implantation of an extended buried diffusion layer by forming a recess trench which extends through the extended buried diffusion layer. The recess trench provides a separation wherein the extended buried diffusion layer on one side of the trench comprises one source/drain region and the extended buried diffusion layer on the other side of the trench comprises a second source/drain region. In preferred embodiments of the present invention wherein an array of memory cells is provided by first starting with an extended buried diffusion layer, multiple recess trenches can be formed extending through the extended buried diffusion layer, thus creating multiple discrete areas of buried diffusion implant (doped areas), each of which can serve as a source/drain.

Memory cells in accordance with the present invention include a dielectric material which is disposed on a surface of the substrate above at least one of the at least two source/drain regions. In certain preferred embodiments of the present invention, the dielectric material disposed on a surface of the substrate above at least one of the at least two source/drain regions is preferably a high density plasma dielectric material or any other material capable of completely filling small (e.g., sub-micron) spaces with a minimum occurrence of voids, and more preferably, no voids. Preferably, the dielectric material comprises a high density plasma dielectric material. For example, in one embodiment of the present invention, an etched pattern space having a dimension of less than 0.15 μm can be filled with a high density plasma dielectric material (or another material capable of completely filling the space) with a thickness of about 100 nanometers, with no detectable voids present. Generally, the aspect ratio of the etched pattern space, which is defined as the depth of the etched pattern space to the width of the etched pattern space, can be up to about 5.

In certain preferred embodiments of the present invention, the memory cells can have a dielectric material, or more preferably a high density plasma dielectric material, disposed on the surface of the substrate above each of the source/drain regions. In certain more preferred embodiments of the present invention, a memory cell can further comprise a gate oxide layer disposed between the silicon substrate and the dielectric material. The gate oxide layer can be grown thermally on the surface of the substrate, and in preferred embodiments wherein the substrate comprises silicon, the gate oxide may suitably comprise silicon dioxide. In certain more preferred embodiments of the present invention, the high density plasma dielectric material will comprise an oxide. In the most preferred embodiments of the present invention, the high density plasma dielectric material will comprise silicon dioxide.

The memory cells according to the present invention also comprise a charge-trapping layer disposed on the surfaces of the dielectric material and the recess trench surface. As used herein, "charge-trapping layer" refers to a layered structure which is capable of trapping localized charge, wherein localization refers to trapped charge that exhibits little, if any, lateral movement within the trapping layer. In general, charge-trapping layers in accordance with the present invention can comprise a bottom barrier layer for providing a degree of insulation between the channel region of the substrate and a middle trapping layer of a non-conductive material, and a top barrier layer to provide insulation between the middle trapping layer and the gate material. The charge trapping layer may be any dielectric layer or layers that are capable of or facilitate electron trapping. Accordingly, to facilitate electron trapping, the charge trapping layer generally has a layer with a lower barrier height than the layers sandwiching it (i.e., two layers with relatively higher barrier heights sandwiching a layer with a relatively lower barrier height). In the case of an ONO tri-layer charge trapping layer, the oxide layers have a barrier height of about 3.1 eV whereas the nitride layer has a barrier height of about 2.1 eV. In this connection, an electron well is created in the middle layer.

Suitable charge-trapping layers include, for example, an ONO trilayer, an oxide/nitride bilayer dielectric, a nitride/oxide bilayer dielectric, an ONONO multilayer, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), an oxide/hafnium oxide/oxide trilayer dielectric, and the like (in each case, the first layer mentioned is the bottom layer while the last layer mentioned is the top layer). The charge trapping layer may also comprise a layer of silicon dioxide having two separate islands of polycrystalline silicon, sandwiched between two layers of silicon dioxide.

In certain preferred embodiments of the present invention, the charge trapping layer comprises an ONO structure (oxide layer-nitride layer-oxide layer), and even more preferably silicon dioxide/silicon nitride/silicon dioxide. The bottom oxide layer of ONO charge-trapping layers in accordance with preferred embodiments of the present invention can have a thickness of about 3 to about 10 nanometers. The middle nitride layer of ONO charge-trapping layers in accordance with preferred embodiments of the present invention can have a thickness of about 5 to about 10 nanometers. The top oxide layer of ONO charge-trapping layers in accordance with preferred embodiments of the present invention can have a thickness of about 5 to about 15 nanometers. Most preferably, an ONO layer comprises a bottom oxide layer having a thickness of about 3 to about 10 nanometers, a middle nitride layer having a thickness of about 5 to about 10 nanometers, and a top oxide layer having a thickness of about 5 to about 15 nanometers.

In those preferred embodiments where the charge trapping layer comprises $SiO_2/Si_3N_4/SiO_2$, one or both of the silicon dioxide layers may be a silicon-rich silicon dioxide layer. One or both of the silicon dioxide layers may also be an oxygen-rich silicon dioxide layer. One or both of the silicon dioxide layers may be a thermally grown or a deposited oxide. One or both of the silicon dioxide layers may be nitrided oxide layers. The nitride may be a silicon-rich silicon nitride layer or a silicon nitride containing oxygen. The nitride may also be an nitrogen-rich silicon nitride layer.

The memory cells in accordance with the present invention further comprise a gate material layer disposed on the charge-trapping layer. The gate material layer in accordance with the present invention can comprise any conductive material. The gate material preferably comprises a polycrystalline silicon layer, which may be either n-type or p-type doped, and a metal silicide layer disposed on the polycrystalline silicon layer. The polysilicon layer is disposed on the surface of the charge-trapping layer and can have a thickness of about 200 to about 500 nanometers, as measured from the top of the dielectric material disposed on the surface of the substrate above one or more of the source/drain regions. In certain more preferred embodiments of the present invention, the polycrystalline silicon is n-type doped. In certain preferred embodiments of the present invention, a chemical/mechanical polishing process can be carried out to planarize the topology of the polysilicon surface resulting from the recess trenches. The metal silicide gate layer in accordance with preferred embodiments of the present invention can comprise a metal silicide material selected from tungsten silicide, titanium silicide, cobalt silicide, and nickel sulicide. The metal suicide thickness is preferably about 60 nanometers to about 200 nanometers.

Exemplary methods according to the present invention for manufacturing memory cells will now be described with reference to FIGS. 2a through 2g, FIGS. 3a & 3b, and FIGS. 4a through 4d.

Methods in accordance with the present invention include providing a semiconductor substrate having at least two source/drain regions, and a dielectric material disposed on the substrate above at least one of the at least two source/drain regions, wherein the at least two source/drain regions are separated by a recess trench which extends downward into the substrate to a depth position below the at least two source/drain regions, as described above in reference to the memory cells of the present invention.

Figure 2A:
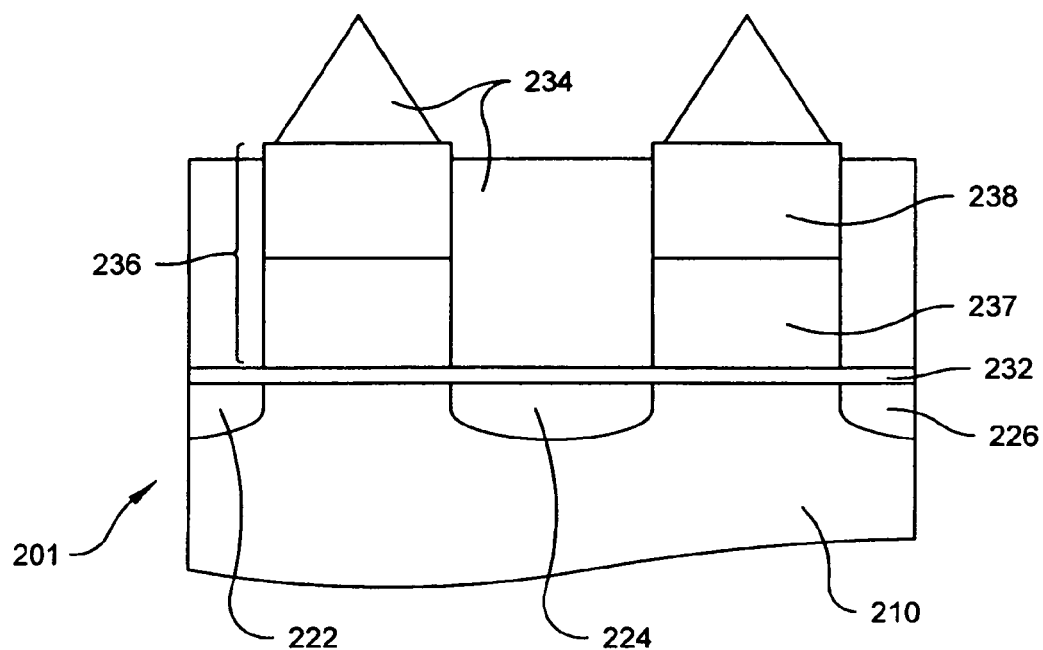
FIGS. 2a-2g are cross-sectional schematic representations illustrating a method of production of an NROM cell in accordance an embodiment of the present invention at various stages of production.

Referring to FIGS. 2a-2g, in one preferred embodiment of the methods according to the present invention, a silicon substrate (210) in FIG. 2a, which has been lightly doped, preferably with p-type doping, is provided. A thin gate oxide layer (232) can preferably be disposed on the surface of the substrate (210). The gate oxide layer can be formed via any known manner, and is preferably thermally grown using known thermal oxidation procedures. The thin gate oxide layer in certain preferred embodiments can be grown to a thickness of about 5 to about 20 nanometers. The thin gate oxide layer can serve as a stop layer during etching processes. After formation of the optional gate oxide layer, a masking layer (236) is deposited on the surface of the substrate, or as shown in FIG. 2a, on the surface of the gate oxide layer. The masking layer can preferably comprise multiple layers, such as a lower polycrystalline silicon layer (237) and an upper silicon nitride layer (238), but may comprises a single masking material. In certain preferred embodiments wherein the masking layer comprises a polycrystalline silicon layer and a silicon nitride layer, the polycrystalline silicon layer can have a thickness of about 30 to about 150 nm, and the silicon nitride layer can have a thickness of about 20 to about 200 nm. The masking layer(s) may be deposited on the substrate surface or on the gate oxide layer using known masking techniques.

After formation of a masking layer, a source/drain region (bit-line) pattern can be etched in the masking layer. In preferred memory cell arrays formed of memory cells in accordance with the present invention, the source/drain regions comprise parallel lines (bit lines) spaced approximately equidistant from one another. Accordingly, the etched pattern may comprise regularly spaced parallel lines in the masking layer. The etching of the masking layer can be accomplished via any known etching technique. In preferred methods according to the present invention, wherein the masking layer comprises polycrystalline silicon and silicon nitride, etching can be performed using a two-step process with a reactive-ion etching (RIE) tool. In the first step, the nitride layer is removed using $CHF_3$ and/or $CH_3F$ and/or $O_2$ and/or other chemistries. In the second step, the polycrystalline silicon masking layer is removed using $Cl_2$ and/or HBr and/or $O_2$ and/or Ar and/or other chemistries, stopping at the thin gate oxide layer which may optionally be present. In certain preferred embodiments, the thin gate oxide layer can help stop the etching from extending into the substrate.

After the source/drain region (bit-lines) pattern has been etched above the substrate, the source/drain regions (bit-lines) (222, 224, 226) can be formed in the substrate, preferably via ion implantation. As described above, the source/drain regions preferably comprise n-type doped regions. Doping of either p-type or n-type can be carried out using ion implantation. In source/drain region formation according to preferred methods of the present invention, n+doping of the substrate in the regions exposed by the etched pattern is carried out using ion implantation of, for example, arsenic, phosphorus, or nitrogen or other suitable elements described above, at a dosage level of about $10^{19}/cm^3$ to about $10^{20}/cm^3$. The depth of the implantation is preferably about 30 nm to about 200 nm.

Once the source/drain regions are formed, the dielectric material (234) can be deposited above one or more, and most preferably all, of the source/drain regions. The etched masking layer (236) also serves as a pattern for the deposition of the dielectric material (234). In preferred embodiments where the dielectric material comprises a high density plasma dielectric material, the high density plasma material can be deposited using high density plasma chemical vapor deposition (HDPCVD), preferably using SiH4 plasma at a suitable pressure and power such that good fill-in of the HDP dielectric material is achieved.

Figure 2B:
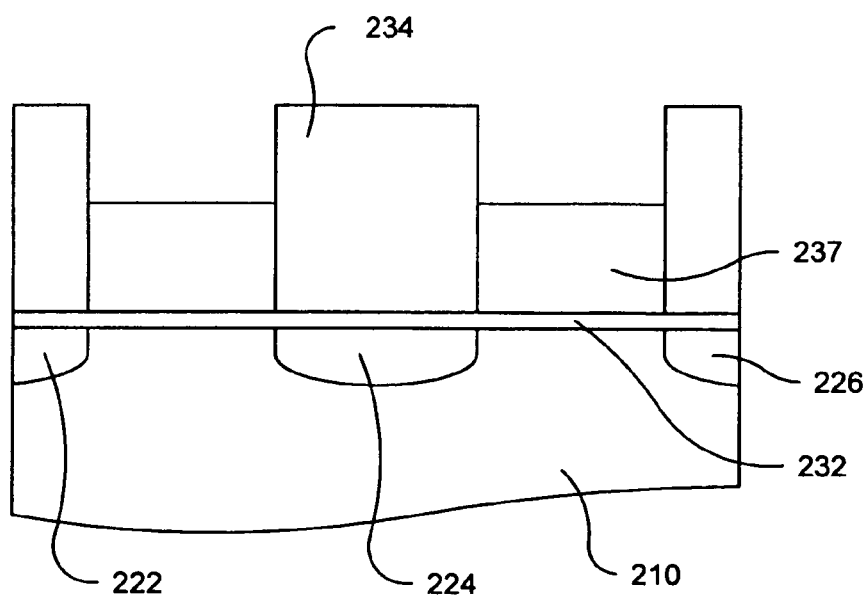
Figure 2C:
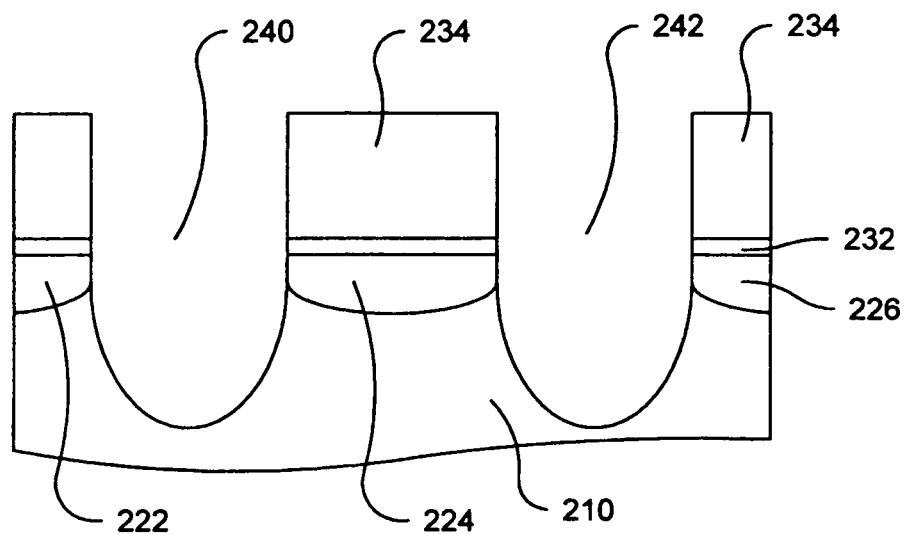

After the dielectric material is deposited, the recess trench(es) can be formed. In general, the remaining masking layer material located between the deposited dielectric materials is removed along with the portion of the gate oxide layer (if present) which is below the masking layer material. The remainder of the trench extending into the substrate can then be formed. In this manner, the dielectric material can serve as a mask for the recess trench formation. For example, as shown in FIG. 2b, in a particularly preferred embodiment, the silicon nitride portion of the masking layer and, in some instances, a small portion of the high density plasma dielectric material including any dielectric material deposited on top of the masking layer, can be removed using solvent wet etching techniques, most preferably using hot phosphoric acid. Subsequently, as shown in FIG. 2c, the remainder of the recess trench(es) (240, 242) can be formed by removing the polycrystalline silicon layer (237), the gate oxide layer (232), which are shown in FIG. 2b, and a portion of the substrate material (210). Preferably, the aspect ratio of the trench etching is about 1.5-3. As used herein, "the aspect ratio of the trench etching" refers to the depth of the trench etch as measured from the surface to the width of the trench.

Figure 2D:
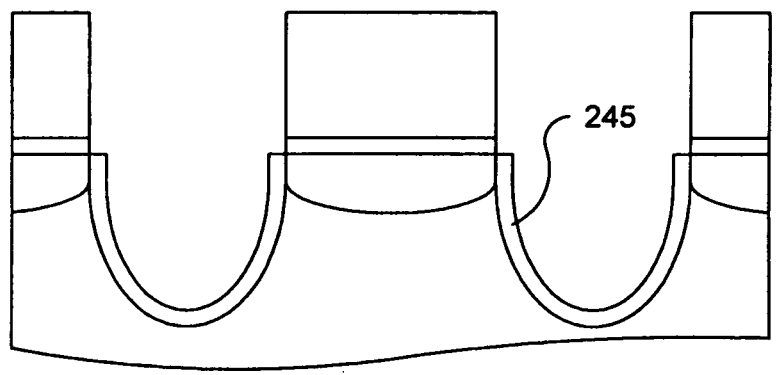
Figure 2E:
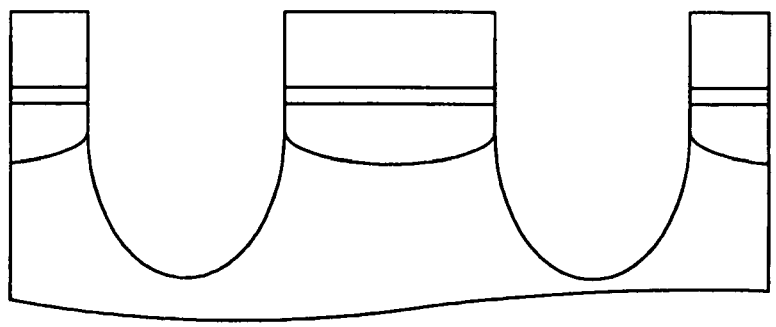

In certain more preferred embodiments of the present invention, the formation of the recess trench(es) further includes a surface treatment of the exposed surface of the trench. The exposed surface of the trench can be rough and irregular after formation of the trench by etching, and is preferably treated to provide a better surface for the formation of the charge-trapping layer. This is also referred to as removing the dislocation of the trench. In a particularly preferred method according to the present invention wherein a surface treatment is carried out on the exposed surface of the recess trench as shown in FIGS. 2d and 2e, a sacrifice liner oxide (245) is formed on the exposed surface of the trench and subsequently removed. Preferably, the sacrifice liner oxide (245) is thermally grown via a high temperature furnace, and can have a thickness of about 10 nm. The sacrifice liner oxide is preferably removed using a non-aggressive technique, such as, for example, via light wet etching or vapor. Most preferably, etching with dilute HF is used. The recess trenches (240, 242) with the sacrifice liner oxide removed are shown in FIG. 2e.

Figure 2F:
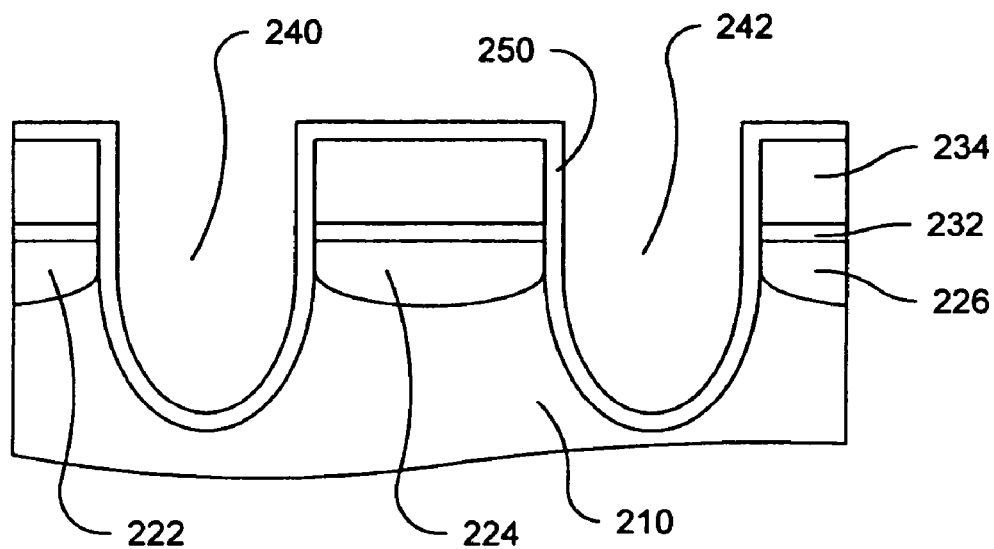

After formation of the recess trench(es), the charge-trapping layer can be formed over the dielectric material and the exposed and preferably treated surface of the trench(es). FIG. 2f shows the location of a charge-trapping layer (250) after formation in accordance with a preferred method of the present invention. In certain preferred embodiments of the present invention wherein the charge-trapping layer comprises an ONO layer, the three layers are individually formed. The bottom oxide layer is formed, followed by formation of the nitride layer which is then followed by formation of the top oxide layer.

Figure 2G:
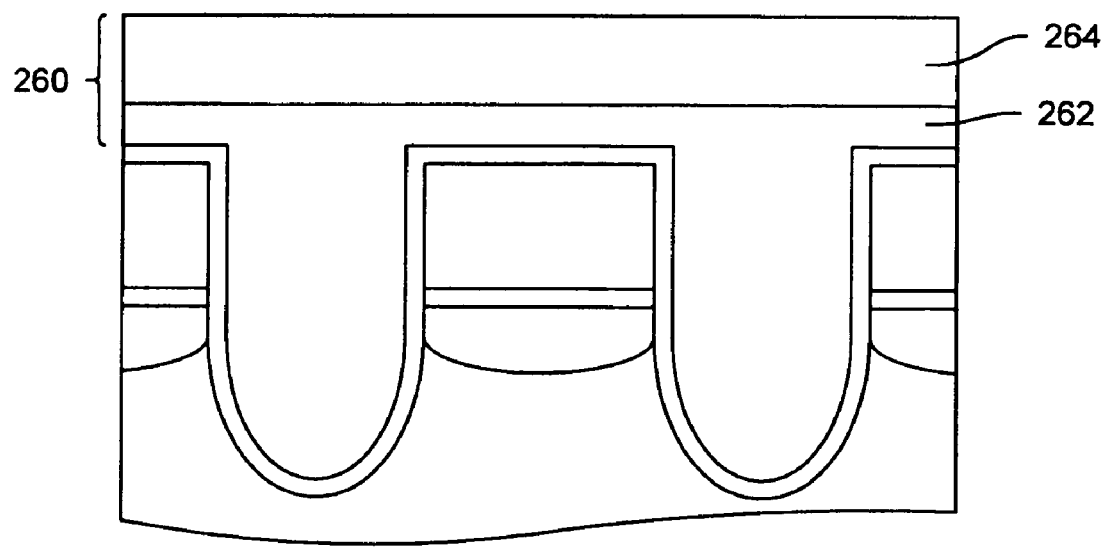

After formation of the charge-trapping layer, the gate can be formed over the charge-trapping layer. FIG. 2g shows the location of a gate (260) after formation, in accordance with a preferred method of the present invention. In certain preferred embodiments of the present invention, the gate can include multiple layers of material. For example, as shown in FIG. 2g, the gate can be formed by first forming a layer of polycrystalline silicon (262), followed by formation of a metal silicide layer (264) on top of the poly-Si.

Figure 3A:
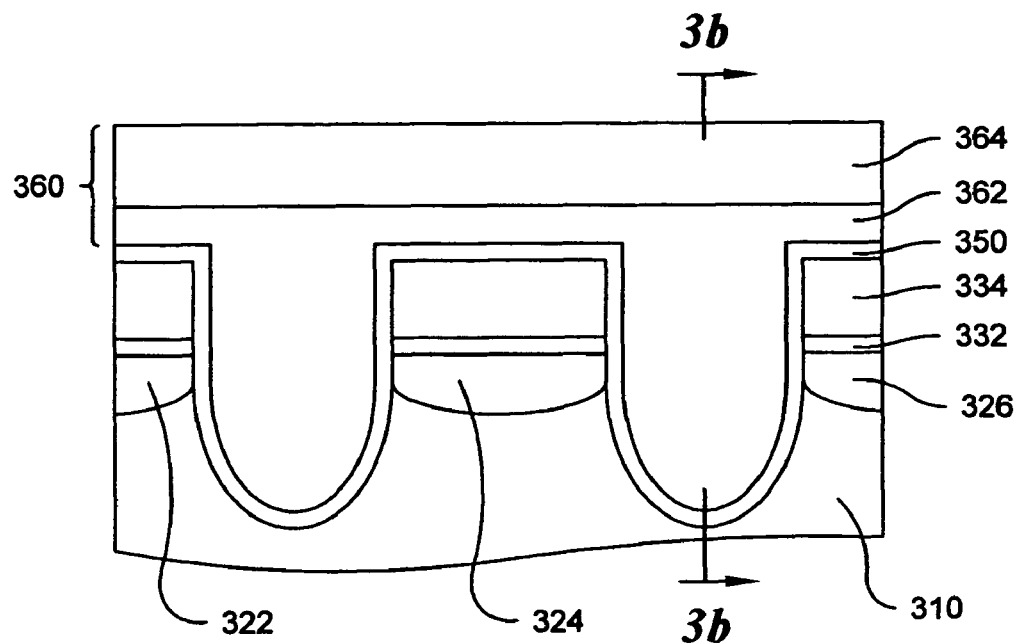
Figure 3B:
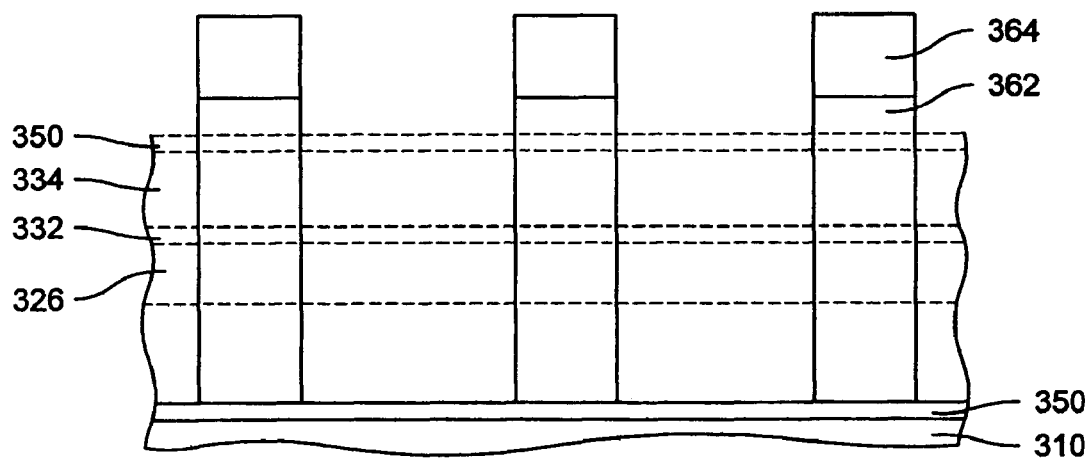

In a memory cell array comprising memory cells in accordance with the present invention, the gate will preferably be patterned as regularly space parallel lines perpendicular to the source/drain regions (bit lines). The patterning can be carried out using known masking and etching techniques. Gate patterning in accordance with preferred embodiments of the present invention is shown in FIGS. 3a and 3b. Gates (360a, 360b, 360c) are shown in FIG. 3b. The view shown in FIG. 3b is taken along line 3b-3b shown in FIG. 3a. As shown in FIG. 3b, the polycrystalline silicon (362) and the metal silicide (364) are patterned in lines perpendicular to the source/drain regions (bit lines). The charge-trapping layer (350) is shown extending along the entire substrate surface between gates. However, the charge-trapping layer may be positioned under only the gates as well.

Figure 4A:
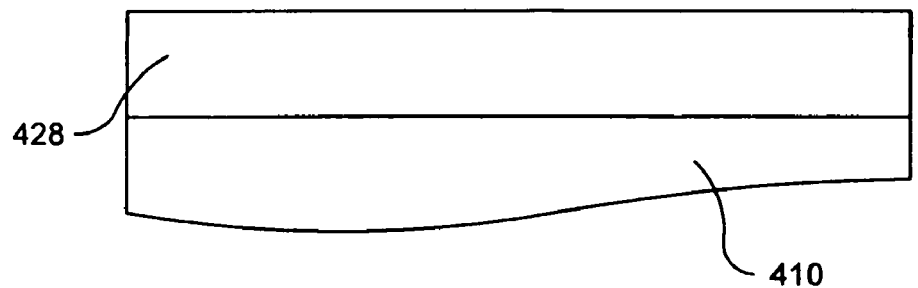
FIGS. 4a-4d are cross-sectional schematic representations illustrating a method of production of an NROM cell prepared in accordance with another embodiment of the present invention, at various stages of production.
Figure 4B:
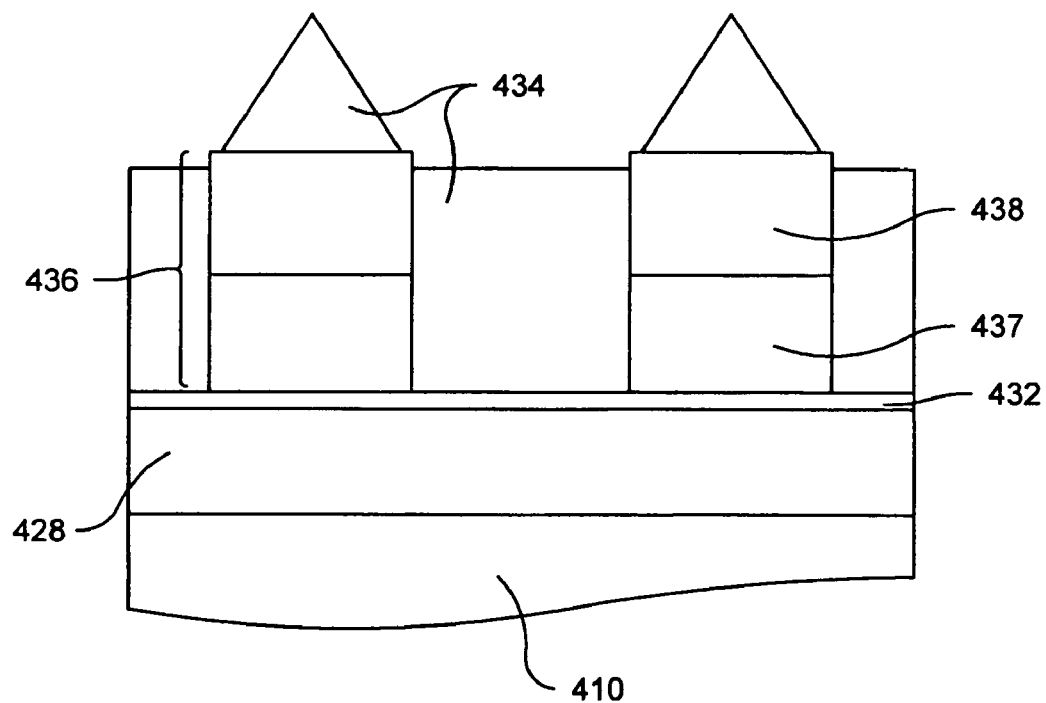
Figure 4C:
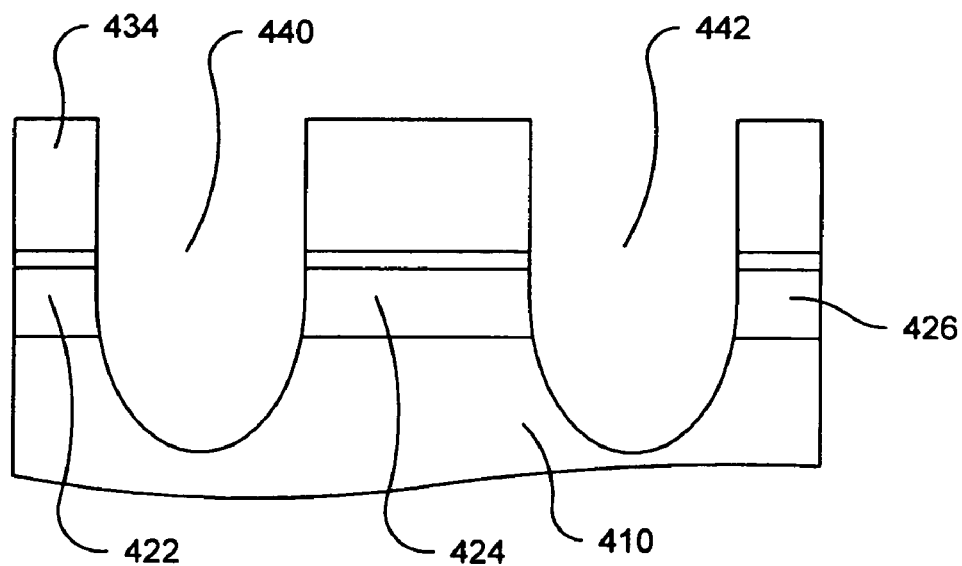
Figure 4D:
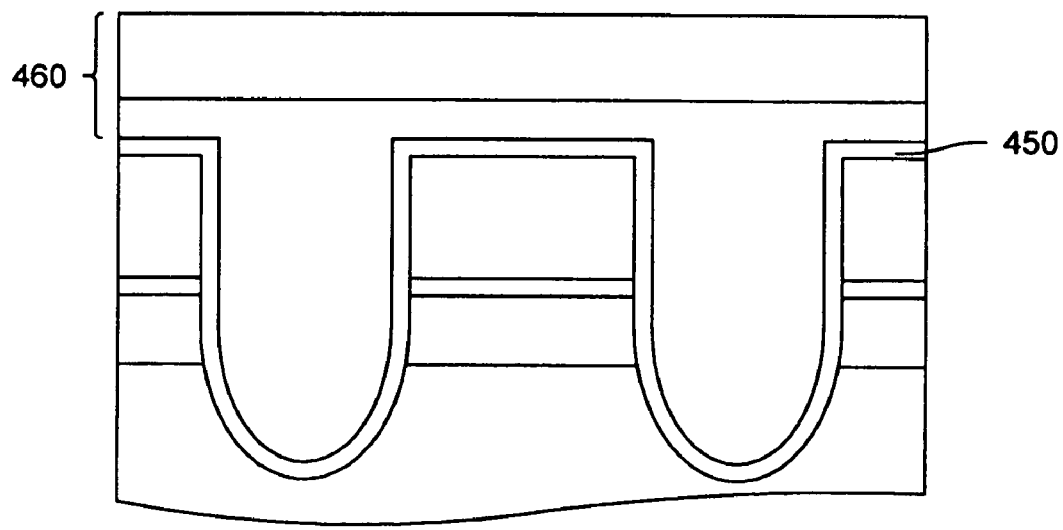

In another preferred embodiment of the methods according to the present invention, as depicted in FIG. 4a, a substrate is provided having an extended buried diffusion layer (428) below the surface of the substrate (410). Masking, pattern etching and dielectric material, preferably high density plasma dielectric material, deposition can then be carried out as described above to provide a structure as depicted in FIG. 4b. Then, using the deposited dielectric material as a mask for the recess trench(es) (440, 442) in FIG. 4c, the previously deposited masking layer (436), as shown in FIG. 4b, can be removed to form the recess trench(es). In this manner, as shown in FIG. 4c, the at least two source/drain regions (422, 424, 426) are formed from the extended buried diffusion layer (428). Finally, as shown in FIG. 4d, a charge-trapping layer (450) and a gate (460) can be formed, as described above with respect to other embodiments of the present invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method comprising:
   providing a semiconductor substrate having at least two source/drain regions, and a dielectric material disposed on the substrate above at least one of the at least two source/drain regions wherein the dielectric material has an exposed surface, and wherein the at least two source/drain regions are separated by a recess trench having an exposed surface, wherein the trench extends downward into the substrate to a depth position below the at least two source/drain regions;
   forming a charge-trapping layer on the exposed surfaces of the dielectric material and the recess trench; and
   forming a gate above the charge-trapping layer,
   wherein the dielectric material is disposed in steps comprising: depositing a masking layer on a surface of the substrate; etching a pattern in the masking layer; and depositing the dielectric material in an area of the pattern in the masking layer.

2. The method according to claim 1, wherein the dielectric material comprises a high density plasma dielectric material.

3. The method according to claim 1, wherein providing the semiconductor substrate comprises: providing a substrate having an extended buried diffusion implant region; depositing the dielectric material on a surface of the substrate above one or more areas of the extended buried diffusion implant region; and forming the recess trench such that the recess trench extends downward into the substrate through the extended buried diffusion implant region to form the at least two source/drain regions.

4. A method comprising:
   providing a semiconductor substrate having at least two source/drain regions, and a dielectric material disposed on the substrate above at least one of the at least two source/drain regions wherein the dielectric material has an exposed surface, and wherein the at least two source/drain regions are separated by a recess trench having an exposed surface, wherein the trench extends downward into the substrate to a depth position below the at least two source/drain regions;
   forming a charge-trapping layer on the exposed surfaces of the dielectric material and the recess trench; and
   forming a gate above the charge-trapping layer,
   wherein providing the semiconductor substrate comprises: forming the at least two source/drain regions in the substrate; depositing the dielectric material on a surface of the substrate above one or more of the at least two source/drain regions; and forming the recess trench between the at least two source/drain regions such that the recess trench extends downward into the substrate to the depth position below the at least two source/drain regions.

5. The method according to claim 4, wherein forming the at least two source/drain regions and depositing the dielectric material comprises: providing a substrate having a gate oxide layer disposed on a surface of the substrate; depositing a masking layer on the gate oxide; etching a pattern in the masking layer; forming the at least two source/drain regions in the substrate in one or more areas of the etched pattern; and depositing the dielectric material in one or more areas of the etched pattern area above at least one of the source/drain regions.

6. The method according to claim 5, wherein the masking layer comprises a layer of polycrystalline silicon disposed on the gate oxide and a layer of silicon nitride disposed on the polycrystalline silicon layer.

7. The method according to claim 4 wherein the dielectric material is deposited above the at least two source/drain regions and serves as a masking layer for the forming of the recess trench.

8. The method according to claim 1, wherein providing the semiconductor substrate comprises etching the recess trench in the substrate and surface treating the exposed surface of the etched recess trench.

9. The method according to claim 8, wherein surface treating the exposed surface of the recess trench comprises forming a sacrifice liner oxide on the exposed surface and removing the sacrifice liner oxide.

10. The method according to claim 1, wherein the at least two source/drain implant regions are formed using ion implantation.

11. The method according to claim 10, wherein the ion implantation comprises n-type doping.

12. The method according to claim 11, wherein the n-type doping concentration is from about $10^{19}/cm^3$ to about $10^{20}/cm^3$.

13. The method according to claim 10, wherein the depth of the implant regions is from about 30 nanometers to about 200 nanometers.

14. The method according to claim 2, wherein the high density plasma dielectric material comprises an oxide.

15. The method according to claim 1, wherein the charge-trapping layer comprises an ONO layer.

16. The method according to claim 15, wherein the ONO layer comprises a bottom oxide layer having a thickness of about 3 nanometer to about 10 nanometers, a middle nitride layer having a thickness of about 5 nanometers to about 10 nanometers, and a top oxide layer having a thickness of about 5 nanometers to about 15 nanometers.

17. The method according to claim 1, wherein the gate comprises a polycrystalline silicon layer formed on the charge-trapping layer and a metal silicide layer formed on the polycrystalline silicon layer.

18. The method according to claim 17, wherein the polycrystalline silicon layer has a thickness of about 200 nanometers to about 500 nanometers, as measured from the top of the dielectric material disposed on the surface of the substrate above one or more of the source/drain regions, and the metal silicide layer has a thickness of about 60 nanometers to about 200 nanometers.

19. The method according to claim 1, further comprising planarizing the gate.

20. The method according to claim 16, further comprising planarizing the polycrystalline silicon layer prior to formation of the metal silicide layer.

21. The method according to claim 17, wherein the metal silicide layer comprises at least one compound selected from the group consisting of titanium silicide, tungsten silicide, cobalt silicide, and nickel silicide.

* * * * *